United States Patent [19]

Small et al.

[11] Patent Number: 5,241,222
[45] Date of Patent: Aug. 31, 1993

[54] DRAM INTERFACE ADAPTER CIRCUIT

[75] Inventors: Jeffrey A. Small, Rochester; Alan T. Torok, Fairport, both of N.Y.

[73] Assignee: Eastman Kodak Company, Rochester, N.Y.

[21] Appl. No.: 810,978

[22] Filed: Dec. 20, 1991

[51] Int. Cl.⁵ ................ H03K 19/20; H03K 19/0175; G11C 7/00
[52] U.S. Cl. .................................... 307/449; 307/475; 365/193
[58] Field of Search ................. 307/449, 475; 365/193

[56] References Cited

U.S. PATENT DOCUMENTS 4,649,511  3/1987  Gdula ..................... 365/222
4,797,850  1/1989  Amitai .................... 365/193
5,005,157  4/1991  Catlin ..................... 365/222

Primary Examiner—Edward P. Westin
Assistant Examiner—Benjamin D. Driscoll
Attorney, Agent, or Firm—Edward Dugas

[57] ABSTRACT

The present invention is an interface adapter circuit that allows multiple types of 256K by 16 bit dynamic random random access memories to be used by system manufacturers. The interface adapter circuit selects a type of outputs signal set to produce responsive to a mode selection signal. The circuit converts an input signal set including a column address probe and low and high by write signals into either a first output signal set, including one column address strobe and high and low byte write signals, or a second output signal set including a single write signal and high and low column address signals, responsive to the selection signal. The circuit includes a logic circuit for producing the signals and flip flops for holding the signal produced. The flip flops also synchronize other memory address, etc. signals with the signals produced by the adapter circuit. The interface adapter circuit can also convert write nd column address timing signals and low and high byte write signals into the two sets responsive to a selection signal.

10 Claims, 3 Drawing Sheets

DRAM INTERFACE ADAPTER CIRCUIT

BACKGROUND OF THE INVENTION

1. Field of the Invention

The present invention is directed to an interface circuit that allows 256k×16 bit dynamic random access memories (DRAMs) from different manufacturers to be used as desired by system designers and, more particularly, to an interface circuit that adapts memory location selection and strobe signals to two different types of DRAMs by selectably producing column address strobes and/or low and high byte selection signals as necessary to allow writing into either or both 8 bit bytes of a 16 bit word.

2. Description of the Related Art

In general, 256K×16 bit DRAMs are available in two configurations. In both configurations, there are nine or more address pins, which are multiplexed by row-address strobe (RAS) and column address strobe (CAS) signals to form eighteen address bits. To address a location within the DRAM, one group of bits of the address are applied to the address pins, and are latched into the DRAM on the falling edge of the RAS. Then the remaining group of bits of the address are applied to these same address pins and are then latched into the DRAM on the falling edge of the CAS. Thus, eighteen address bits are latched into the DRAM, allowing any one of 262,144 (256K) 16 bit wide locations to be addressed.

However, in 256K×16 bit DRAMS it is often desired to be able to select only the lower byte, only the upper byte, or both bytes of the 16 bit data word when writing to the DRAM. In general, this selection is not required when reading, as the extra byte may simply be ignored. This selection ability is important when writing to the DRAM, otherwise the data in the extra byte would be destroyed by overwriting it with unwanted data. This is particularly important in video pixel processing operations where pixels are eight bits. Manufacturers of the DRAMs have provided two different means for selecting which (or both) bytes are written. One method is to provide two CAS pins, one for the low byte and one for the high byte. The other method is to provide two write pins, one for the low byte and one for the high byte. Writing to a byte only occurs when the appropriate write pin is held low for sufficient setup and hold times relative to the falling edge of the appropriate CAS lines.

Some manufacturers provide such DRAMs with 2 CAS pins and one write pin for, example the 514160 JP/ZP from Hitachi, others provide DRAMs with one CAS pin and two write pins, for example the M5M44160AJ from Mitsubishi. At least one manufacturer provides DRAMs in both configurations, for example the NEC 4241600 and NEC 4241610 from NEC. The DRAMs configured with one of these sets of selection signals is not interchangeable with DRAMS configured with the other set of selection signals. The DRAMS are interchangeable in all other respects since they use the same memory location address signals, etc. Incidentally, if the two CAS lines are provided for the DRAM, they may also be used in selectively enabling the output of either or both bytes during reading.

Because DRAMs are commodity items, it is desirable to have maximum flexibility in selecting the DRAM vendor. Thus, a means of easily configuring a system during manufacture to be able to use either style of DRAM is desirable.

SUMMARY OF THE INVENTION

It is an object of the present invention to allow manufacturers of devices that use 256k×16 bit memories to buy devices from different memory manufacturers.

It is also an object of the present invention to provide a consistent signal interface for 256k×16 bit memories allowing designers to design devices which use these memories more easily without worrying about the interface.

It is another object of the present invention to provide an interface that requires a select signal that selects between producing a first set of signals including two column address strobe signals and a single write signal and a second set including two write signals and a single column address signal.

It is another object of the present invention to provide an interface circuit that allows byte writes to 256×16 bit memories with 8 bit bytes.

The above objects can be attained by a first embodiment of an interface adapter circuit that converts, responsive to a selection signal, an input signal set, including a column address strobe and low and high byte write signals, into either a first signal set, including one column address strobe signal and high and low byte write signals, or a second set, including a single write signal and high and low column address strobe signals. The circuit includes a logic circuit and flip flops for holding and synchronizing the signals produced. A second embodiment of the interface circuit converts write and column address strobe timing signals and low and high byte signals into the two sets responsive to a selection signal.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
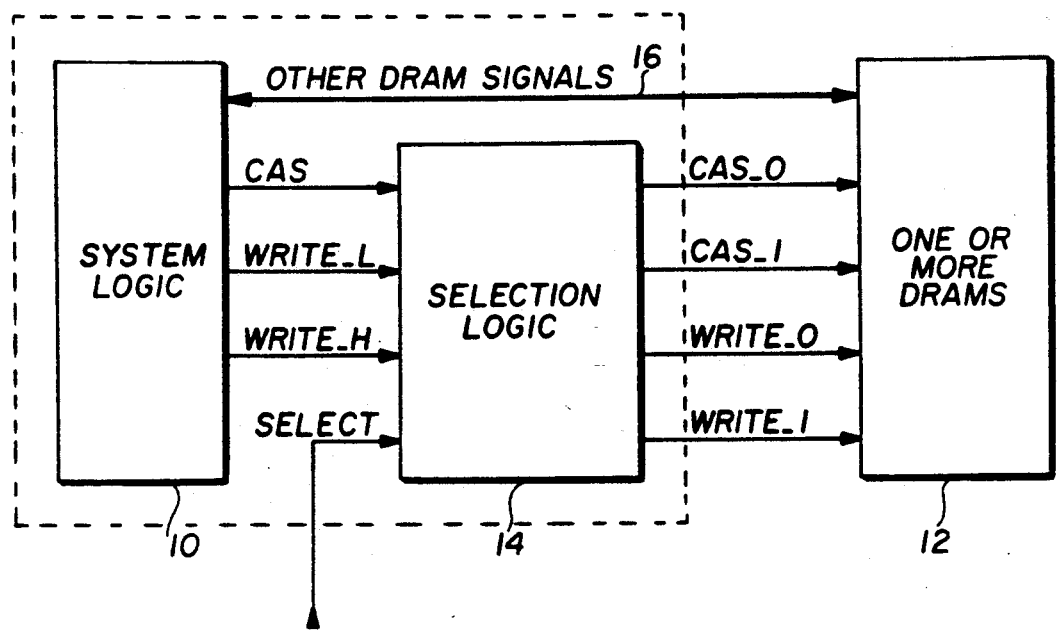
FIG. 1 is a block diagram of a first embodiment of the present invention.

In a first embodiment of this invention, shown in FIG. 1, a system 10, such as a computer or other device that needs to read data from a 256k by 16 bit memory 12 or write 8 bit bytes to such a memory 12, provides two write signals (WRITE L AND WRITE H) and a column address strobe (CAS) signal as inputs to a selection logic circuit 14. This system 10 also provides the other necessary conventional memory address signals, etc, to the memory 12 over separate conventional signal lines 16. In addition, this logic circuit 14 requires a configuration or mode selection input signal SELECT which is used to select the desired DRAM 12 configuration. This logic 14 provides four outputs to the DRAM: two write lines (WRITE_0 and WRITE_1) and two CAS lines (CAS_0 and CAS_1). Both the CAS and the write lines are active when they are low. The selection logic circuit 14 can be a separate circuit package or can be included as part of a larger system implemented on an application specific integrated circuit.

The outputs are produced in one of two sets depending on the selection signal. For one state of the configuration selection input signal (which selects the two write, one CAS line mode), the signals WRITE_L and WRITE_H are provided by the logic circuit 14 to the WRITE_0 and WRITE_1 lines of the DRAM 12, while the CAS_input signal is provided by the logic circuit 14 to the CAS_0 line of the DRAM 12. For this state of the configuration, the line CAS_1 is unused.

For the other state of the configuration selection input signal (which selects the one write, two CAS_line mode), if either or both of the WRITE_L or WRITE_H signals are active, the logic activates the WRITE_0 line to the DRAM's single write line. The CAS_0 line is activated whenever both the WRITE_L and CAS_input lines are simultaneously active and/or the CAS_1 line is activated whenever both the WRITE_H and CAS_input lines are simultaneously active. Because the CAS_0 and CAS_1 lines must be activated to read from the DRAM, they are also activated by the logic whenever the CAS input is active and both of the WRITE_L and WRITE_H lines are inactive simultaneously.

The logic required for the selection logic circuit 14 can be specified by a truth table, as set forth in Table 1 below in which X indicates "don't care", WL indicates the value of the write low input, WH indicates the value of the write high input and CAS_indicates the value of the column address strobe input.

TABLE 1

| Inputs | | | | Outputs | | | |
|---|---|---|---|---|---|---|---|
| Select | Write_L | Write_H | CAS | Write_0 | a Write_1 | CAS_0 | CAS_1 |
| 0 | X | X | X | WL | WH | CAS | X |
| 1 | X | X | 1 | 1 | 1 | 1 | 1 |
| 1 | 1 | 1 | 0 | 0 | X | 0 | 0 |
| 1 | 1 | 0 | 0 | 0 | X | 0 | 1 |
| 1 | 0 | 1 | 0 | 0 | X | 1 | 0 |
| 1 | 0 | 0 | 0 | 1 | X | 0 | 0 |

From the above truth table the necessary logic can be produced in a number of different ways by a person of ordinary skill in the art using conventional logic gates and conventional logic design tools such as Idea Station from Mentor Graphics. However, FIG. 2 illustrates a preferred implementation of circuit 14.

Figure 2:
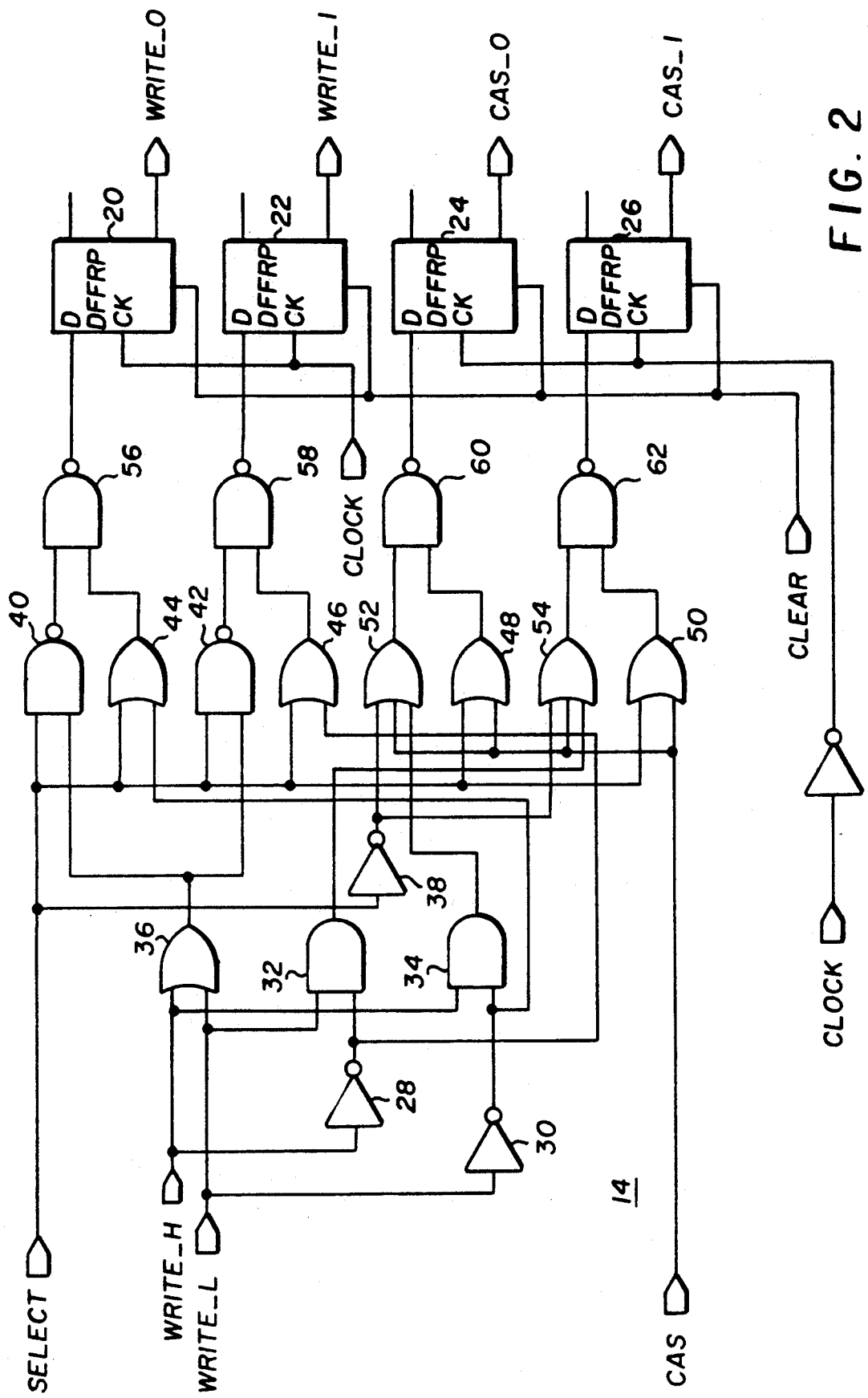
FIG. 2 is a circuit diagram of the interface circuit of FIG. 1.

In the circuit 14 of FIG. 2, at power up or reset, the clear signal sets the outputs of conventional D flip flops 20, 22, 24 and 26 to a known state, zero. It is possible for the clear signal to result in destruction of data in the DRAM 12, however, in most applications this is not a problem if the clear signal is produced at power up. Once cleared the flip-flops are used to store the signals produced and to synchronize the timing with the signals on signal lines 16. The write high and write low signals are inverted by inverters 28 and 30 and applied to AND gates 32 and 34 which produce outputs whenever both the write signals are not high. An OR gate 36 produces an output whenever either of the signals is high. A selection signal is applied to NAND gates 40 and 42 and OR gates 44, 46, 48 and 50. An inverted selection signal produced by inverter 38 is applied to OR gates 52 and 54. The CAS, write and inverted write signals are also applied to gates 42-54. The outputs of gates 40 and 44 are applied to NAND gate 56, the outputs of gates 42 and 46 are applied to NAND gate 58, the outputs of gates 48 and 52 are applied to NAND gate 60 and the outputs of gates 50 and 54 are applied to NAND gate 62. The NAND gates 56, 58, 60 and 62 are connected respectively to flip-flops 20, 22, 24 and 26 which synchronously produce the outputs to the DRAM 12. It should be noted that the CAS_signals are clocked on opposite edges of the clock signal than the write signals and the clock signal is externally supplied.

Figure 3:
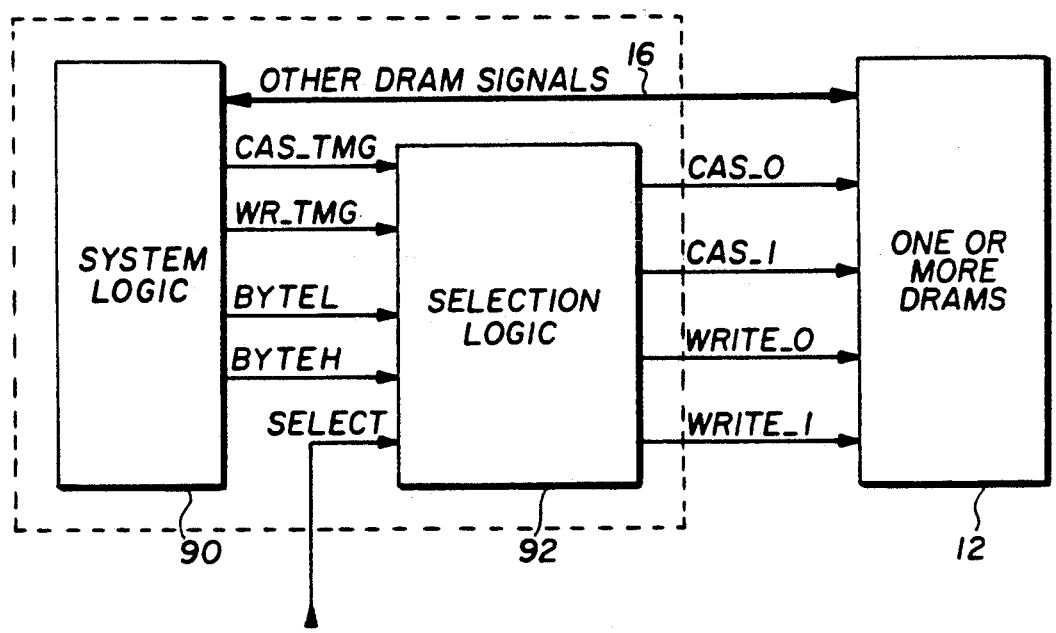
FIG. 3 is a block diagram of second embodiment of the present invention.

A second embodiment of the present invention is designed for a system 90 that produces four signals for a selection logic circuit 92, as shown in FIG. 3. This embodiment allows the timing of the low and high byte signals to be specified independently and the constraints on the timing relations between WRITE_L, WRITE_H and CAS of FIGS. 1 and 2 are removed. In FIG. 3 the timing information is provided by the column address timing signal CAS_TMG and write timing signal WR_TMG and byte selection information is provided by BYTEL and BYTEH.

For one state of the configuration selection input signal SELECT (which selects the two write, one CAS line mode), the CAS_0 signal to the DRAM is activated whenever the CAS_TMG input to the logic is active. The CAS_1 signal is unused. The WRITE_0 signal to the DRAM 12 is activated only when the WRT TMG timing signal and the BYTEL signals are simultaneously active. The WRITE_1 signal to the DRAM 12 is activated only when the WRT TMG timing signal and the BYTEH signals are simultaneously active.

For the other state of the configuration selection input signal SELECT (which selects the one write, two CAS_line mode), the WRITE_0 signal to the DRAM is activated when the WR_TMG signal is active and simultaneously, either or both of the BYTEL or BYTEH signals are active. The WRITE_1 signal is unused The CAS_0 signal to the DRAM 12 is activated only when the CAS_TMG signal is active and the BYTEL signal is simultaneously active. The CAS_1 signal to the DRAM 12 is activated only when the CAS_TMG signal is active and the BYTEH signal is simultaneously active. The CAS_signals are needed during reading, so whenever both BYTEL and BYTEH are inactive and CAS_TMG is simultaneously active, the logic activates both CAS_0 and CAS_1.

The logic required for the selection logic circuit 92 can be specified by a truth table as set forth below in Table 2 where WR TMG indicates the input value of the write timing signal, CAS TMG indicates the input value of the column address strobe timing signal and X indicates "don't care."

TABLE 2

| INPUTS | | | | | OUTPUTS | | | |
|---|---|---|---|---|---|---|---|---|
| SELECT | BYTEL | BYTEH | CAS TMG | WR TMG | WRITE_0 | WRITE_1 | CAS_0 | CAS_1 |
| 0 | 0 | 0 | X | X | WR TMG | WR TMG | CAS TMG | X |
| 0 | 0 | 1 | X | X | WR TMG | 1 | CAS TMG | X |
| 0 | 1 | 0 | X | X | 1 | WR TMG | CAS TMG | X |
| 0 | 1 | 1 | X | X | 1 | 1 | CAS TMG | X |
| 1 | 0 | 0 | X | X | WR TMG | X | CAS TMG | CAS TMG |
| 1 | 0 | 1 | X | X | WR TMG | X | CAS TMG | 1 |
| 1 | 1 | 0 | X | X | WR TMG | X | 1 | CAS TMG |
| 1 | 1 | 1 | X | X | 1 | X | CAS TMG | CAS TMG |

In the first row of Table 2 both bytes are written, in the second the low byte is written while in the third row the high byte is written. In the fourth row and eighth rows a read or idle occurs. In the fifth row again both bytes are written while in the sixth and seventh rows the low and high bytes are written respectively. Once again from the above truth table the necessary logic can be produced in a number of different ways by a person of ordinary skill in the art using conventional logic circuits. However, FIG. 4 illustrates a preferred implementation of circuit 92.

Figure 4:
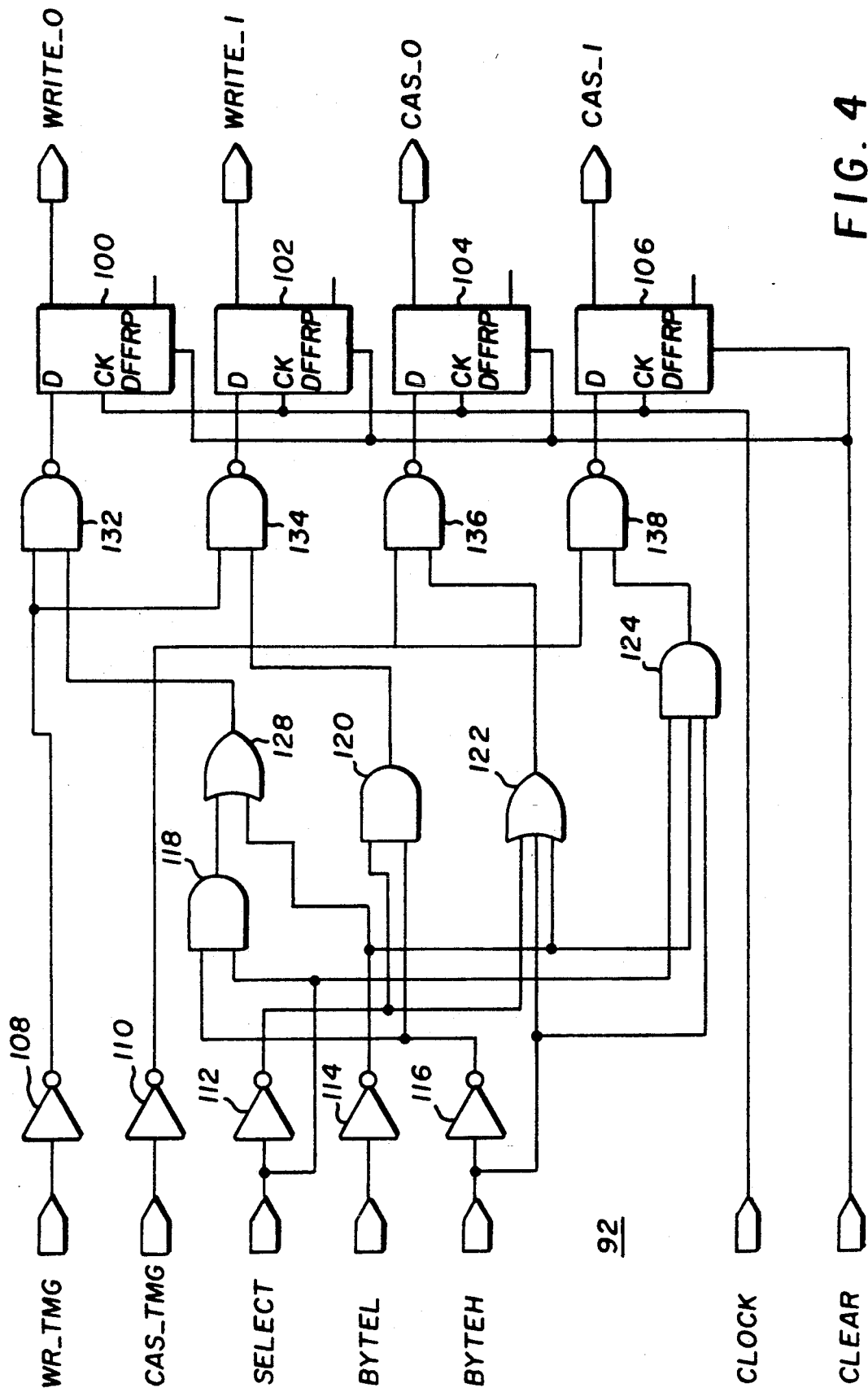
FIG. 4 is a circuit diagram of the interface circuit of FIG. 3.

As in the previous embodiment the clear signal, as illustrated in FIG. 4, sets the outputs of conventional D-flip flops 100, 102, 104 and 106 to zero and the flip flops then store the results and synchronize the outputs with the signals on lines 16. This circuit uses less gates and thus less space than the previous embodiment in addition to removing the timing requirements. Inverters 108 and 110 invert the timing signals while inverters 112, 114 and 116 invert the mode selection and byte select signals. The mode selection signal is applied to AND gate 118 along with the inverted high byte selection signal. The inverted selection signal is applied to AND gate 120 and OR gate 122. The selection signal, the inverted byte low signal and the byte high signal are applied to NAND gate 124. The output of gate 118 and the inverted low byte selection signal is applied to OR gate 128. Various combinations of the outputs of gates 128, 120, 122, and 124 along with the inverted timing signal are applied to NAND gates 132, 134, 136 and 138, while the outputs of these NAND gates 132, 134, 136 and 138 are respectively applied to flip-flops 100, 102, 104 and 106 which produce the outputs to the DRAM 12.

The logic of the present invention as illustrated in FIGS. 2 and 4 can alternately be implemented as a lookup table in a read only memory ROM. The memory stores the outputs at addresses corresponding to the inputs shown in the corresponding truth tables.

It is possible, as should be recognized by those of skill in the art, to produce an embodiment which will convert two CAS_signals and one write signal into the appropriate signals.

The present invention has been described with respect to a byte length of 8 bits and a word length of 16 bits, however, the invention could be applied to different byte and word lengths. Further, the present invention has been described with respect to a particular polarity for the input and output signals. Of course, it is possible to convert any of the signals to signals of opposite polarity by adding inverters where needed.

The many features and advantages of the invention are apparent from the detailed specification and thus it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. An interface circuit for a dynamic random access memory, comprising a logic circuit converting, responsive to a select signal, a column address strobe signal and low/high byte write signals into one of a first set of signals including a pair of column address strobe signals and a single write signal and a second set of signals including a pair of write signals and a single column address strobe signal.

2. An interface circuit as recited in claim 1, further comprising storage means for storing and outputting the one of the first and second sets of signals synchronous with other memory signals.

3. An interface as recited in claim 2, wherein said storage means comprises flip flops connected to said logic circuit.

4. An interface circuit as recited in claim 1, wherein said logic circuit comprises a read only memory storing a lookup table.

5. An interface circuit for a dynamic random access memory, comprising:
   a first AND gate receiving a write low signal and an inverted write high signal;
   a second AND gate receiving a write high signal and an inverted write low signal;
   a first OR gate receiving the write high and low signals;
   a first NAND gate receiving a select signal and connected to the first OR gate;
   a second OR age receiving the select signal and the inverted write low signal;
   a second NAND gate receiving the select signal and connected to the first OR gate;
   a third OR gate receiving the select signal and the inverted write high signal;
   a fourth OR gate receiving an inverted select signal, a column address strobe signal and connected to the second AND gate;
   a fifth OR gate receiving the select signal and the column address strobe signal;
   a sixth OR gate receiving the inverted select signal, the column address strobe signal and connected to the first AND gate;
   a seventh OR gate receiving the select signal and the column address strobe signal;
   a third NAND gate connected to said first NAND gate and said second OR gate;
   a fourth NAND gate connected to said second NAND gate and said third OR gate;

a fifth NAND gate connected to said fourth and fifth OR gates;

a sixth NAND gate connected to said sixth and seventh OR gates;

a first D flip-flop connected to said third NAND gate;

a second D flip-flop connected to said fourth NAND gate;

a third D flip-flop connected to said fifth NAND gate; and a fourth D flip-flop connected to said sixth NAND gate.

6. An interface circuit for a dynamic random access memory, comprising a logic circuit converting, responsive to a select signal, write and column address strobe timing signals and low/high byte write selection signals into one of a first set of signals including a pair of column address strobe signals and a single write signal and a second set of signals including a pair of write signals and a single column address strobe signal.

7. An interface circuit as recited in claim 6, further comprising storage means for storing and outputting one of the first and second sets of signals synchronous with other memory signals.

8. An interface circuit as recited in claim 6, further comprising flip flops connected to said logic circuit.

9. An interface circuit as recited in claim 6, wherein said logic circuit comprises a read only memory storing a lookup table.

10. An interface circuit for a dynamic random access memory, comprising:

a first AND gate receiving a select signal and an inverted byte high signal;

a second AND gate receiving an inverted select signal and the inverted byte high signal;

a first OR gate receiving the inverted select signal, a byte high signal and an inverted byte low signal;

a first NAND gate receiving the select signal, the inverted byte low signal and the byte high signal;

a second OR gate connected to said first AND gate and to receive the inverted byte low signal;

a second NAND gate connected to receive an inverted write timing signal and connected to said second OR gate;

a third NAND gate connected to receive the inverted write timing signal and to said second AND gate;

a fourth NAND gate connected to receive an inverted column address strobe timing signal and to said first OR gate;

a fifth NAND gate connected to receive the inverted column address signal and to said first NAND gate;

a first D flip-flop connected to said second NAND gate;

a second D flip-flop connected to said third NAND gate;

a third D flip-flop connected to said fourth NAND gate; and a fourth D flip-flop connected to said fifth NAND gate.

* * * * *

UNITED STATES PATENT AND TRADEMARK OFFICE
CERTIFICATE OF CORRECTION

PATENT NO. : 5,241,222
DATED : August 31, 1993
INVENTOR(S) : Jeffrey A. Small, et al It is certified that error appears in the above-indentified patent and that said Letters Patent is hereby corrected as shown below:

Abstract, line 7, "probe" should read --strobe--.

Abstract, line 8, "by" should read --byte--.

Abstract, line 14, "signal" should read --signals--.

Abstract, line 17, "nd" should read --and--.

Signed and Sealed this

Eighth Day of November, 1994

Attest:

BRUCE LEHMAN

Attesting Officer

Commissioner of Patents and Trademarks